United States Patent
Jarvis

(10) Patent No.: US 9,593,420 B2
(45) Date of Patent: Mar. 14, 2017

(54) SYSTEM FOR MANUFACTURING GRAPHENE ON A SUBSTRATE

(71) Applicant: Denton Jarvis, Morgan, UT (US)

(72) Inventor: Denton Jarvis, Morgan, UT (US)

(*) Notice: Subject to any disclaimer, the term of this patent is extended or adjusted under 35 U.S.C. 154(b) by 0 days.

(21) Appl. No.: 14/936,165

(22) Filed: Nov. 9, 2015

(65) Prior Publication Data

US 2016/0133462 A1 May 12, 2016

Related U.S. Application Data

(60) Provisional application No. 62/076,758, filed on Nov. 7, 2014, provisional application No. 62/195,647, filed on Jul. 22, 2015.

(51) Int. Cl.

| | | |
|---|---|---|
| H01L 21/00 | (2006.01) |
| H01L 21/16 | (2006.01) |
| C23C 16/50 | (2006.01) |
| C23C 14/06 | (2006.01) |
| C23C 14/22 | (2006.01) |
| C23C 16/26 | (2006.01) |
| C23C 16/448 | (2006.01) |
| C23C 16/513 | (2006.01) |
| C01B 31/04 | (2006.01) |

(Continued)

(52) U.S. Cl.
CPC .......... *C23C 16/50* (2013.01); *C01B 31/0453* (2013.01); *C01G 39/06* (2013.01); *C23C 14/0605* (2013.01); *C23C 14/221* (2013.01); *C23C 16/26* (2013.01); *C23C 16/4481* (2013.01); *C23C 16/4486* (2013.01); *C23C 16/513* (2013.01); *H01L 21/0254* (2013.01); *H01L 21/02422* (2013.01); *H01L 21/02527* (2013.01); *H01L 21/02565* (2013.01); *H01L 21/02631* (2013.01)

(58) Field of Classification Search
CPC ............. H01L 21/76889; H01L 23/345; H01L 23/488; H01L 23/53209; H01L 23/53219; H01L 23/53233; H01L 29/1606; C23C 14/5813; C23C 14/5853; C23C 14/5826; C23C 16/45536; C23C 18/127
USPC ....... 438/104, 311, 308, 455, 463, 424, 597; 257/E21.005, E21.006, E21.046, 257/E21.078, E21.087, E21.13, E21.225, 257/E21.282, E21.284, E21.32, E21.327, 257/E21.517
See application file for complete search history.

(56) References Cited

U.S. PATENT DOCUMENTS

| | | | | |
|---|---|---|---|---|
| 5,519,215 A * | 5/1996 | Anderson | ............ | H01J 49/105 |
| | | | | 250/281 |
| 7,271,397 B2 * | 9/2007 | Bryden | ................ | H01J 49/147 |
| | | | | 250/288 |
| 9,312,117 B2 * | 4/2016 | Hunter | ................ | H01J 49/0013 |

(Continued)

*Primary Examiner* — David Nhu
(74) *Attorney, Agent, or Firm* — Morriss O'Bryant Compagni, PC

(57) ABSTRACT

A method and apparatus for manufacturing a lattice structure of a material on a substrate, wherein the process may be performed at atmospheric pressure, may not require a metallic substrate, may be capable of continuously generating the lattice structure as long as desired, may be as thin as a single layer of the lattice material, and may create the lattice structure with any material that is capable of being vaporized to create a stream of ionized particles and then condensed to form the lattice structure.

14 Claims, 3 Drawing Sheets

(51) Int. Cl.
    *C01G 39/06*     (2006.01)
    *H01L 21/02*     (2006.01)

(56) References Cited

U.S. PATENT DOCUMENTS

2015/0329957 A1* 11/2015 Anthony ............... C23C 14/221
                                                                    427/526

* cited by examiner

US 9,593,420 B2

SYSTEM FOR MANUFACTURING GRAPHENE ON A SUBSTRATE

This application claims benefit of 62/076,758 filed Nov. 7, 2014 and claims benefit of 62/195,647 filed Jul. 22, 2015

BACKGROUND OF THE INVENTION

Field Of the Invention

This invention relates generally to a system and method for manufacturing a lattice structure of a material on a substrate wherein the lattice structure may be as thin as a single layer of the lattice material. While examples in the embodiments may be directed to graphene as the lattice material, the embodiments may also include other materials that may form a lattice structure.

It is desirable to create one or more layers of lattice structures or crystalline lattice structures on a substrate because of the many useful industrial applications of such a structure from any material that can form a lattice structure. Such a material may be referred to as a "lattice material", a "lattice structure material" or as a "material forming a lattice structure" throughout this document. While the examples of embodiments hereinafter will mention graphene, it should be understood that the lattice material that is formed into a lattice structure in these embodiments may include any material that can be vaporized and then condensed into the desired lattice structure and is not limited to graphene.

There are at least four variables in the prior art that have been controlled in order to create graphene on a substrate which may make the process expensive and difficult. The creation of graphene may typically need to be performed in a pressurized state and at high temperatures over a relatively long period of time on a pristine substrate.

A first step may be to prepare a substrate on which graphene may be formed. The substrate material may be metal because of the high temperatures involved. The substrate material may need to have a flat and clean surface that is free of contaminants in order for the graphene lattice structure to be formed.

After cleaning the substrate, it may be disposed within a pressure chamber so that pressure may be applied to the substrate while the lattice structure is being formed. The process may be difficult to control because if the pressure within the pressure chamber is too high, too many layers of graphene may be deposited on the substrate material. However, if the pressure is too low, no layers of graphene may be formed at all. Creating a single layer of graphene may have desirable benefits that require precise control of pressure.

Another factor that may need to be controlled is maintaining a clean environment within the pressure chamber so that contaminants are not deposited on the substrate with the graphene.

The substrate material may also require heating within the pressure chamber in order for the graphene to be deposited thereon. Heating may typically have to be applied for long periods of time, in some cases as long as 14 hours, for the vapor deposition process to occur. The cooling process after vapor deposition may also require long periods of time, in some cases as long as eight hours, in order for the graphene lattice structure to be formed correctly.

Thus, at least one prior art method for creating graphene requires precise control of temperature and pressure over a sustained period of time in a clean environment and on a flat and clean substrate. Furthermore, the end result may only be a small sample of graphene approximately 1 inch by 1 inch square. The process may be further limited because the entire substrate must fit within the pressure chamber.

Finally, it is noted that the gas medium used to initiate graphene lattice growth may be volatile. Under high pressures and temperatures, the environment may be an explosive hazard. Furthermore, the resulting waste material may be toxic and require special handling.

BRIEF SUMMARY OF THE INVENTION

In a preferred embodiment, the present invention is a method and apparatus for manufacturing a lattice structure of a material on a substrate, wherein the process may be performed at atmospheric pressure, may not require a metallic substrate, may be capable of continuously generating the lattice structure as long as desired, may be as thin as a single layer of the lattice material, and may create the lattice structure with any material that is capable of being vaporized to create a stream of ionized particles and then condensed to form the lattice structure.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Figure 1:
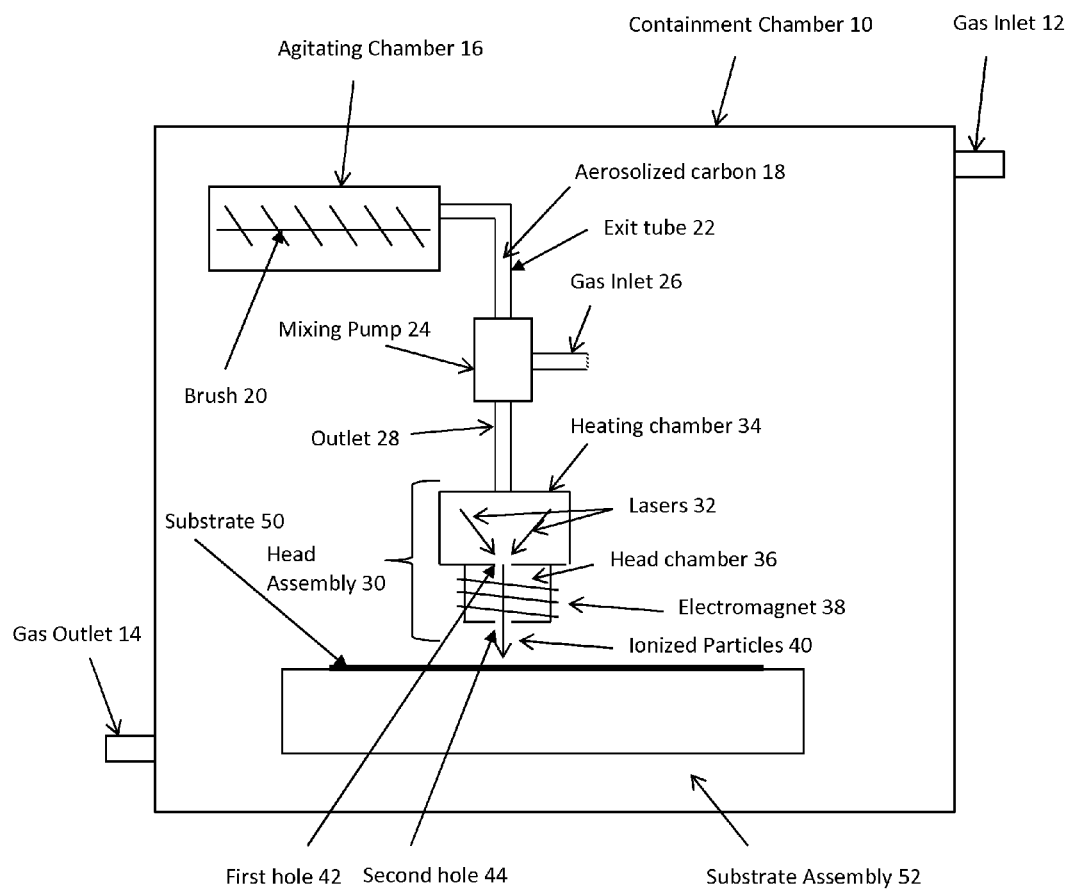
FIG. 1 is a block diagram of the components of a system for manufacturing graphene on a substrate in accordance with the principles of the present invention.

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

A first embodiment of the present invention may be a method and apparatus that may reduce the complexity of the manufacturing process while increasing the output of graphene. A first method of reducing complexity of the system may be to provide a containment system that is designed to keep impurities away from the substrate, but which operates at atmospheric pressure.

Thus, in the first embodiment, a first step may be to provide a system that may not need to be sealed. In other words, no pressurized containment system may be required to implement the first embodiment. Thus, the equipment to be described hereinafter may be disposed within a containment chamber 10 that may provide a clean environment that is not pressured. A gas inlet 12 to the containment chamber 10 may provide a means for introducing a gas into the containment chamber such as carbon dioxide. A gas outlet 14 from the containment chamber 10 may just lead to an ambient air environment.

The size of the containment chamber 10 may be varied according to the size of the equipment disposed therein. For illustration purposes only it is noted that the containment chamber 10 of the first embodiment may be approximately 5 feet by 2 feet by 3 feet, but these dimensions should not be considered as a limiting factor but as an example only, and the dimensions may vary greatly without departing from the present invention.

A first piece of equipment of the first embodiment that may be disposed within the containment chamber 10 may be an agitating chamber 16 used to generate the material to be formed into the lattice structure in a powdered form. In this example, carbon is provided in an aerosol form 18 through agitation so that it may be transported in a column of gas. For example, the carbon may be in the form of graphite if the objective is to obtain a lattice structure of graphene. Because graphite may be tacky, it is disposed within the agitating chamber 16. Any means necessary to agitate the graphite may be used in order to put the graphite into the aerosol form 18 of the material to create the lattice structure.

For example, FIG. 1 shows an agitating chamber 16 that may contain a rotating brush 20. The agitating chamber 16 may also include an exit tube 22 that enables the carbon to leave the agitating chamber.

The exit tube 22 may be coupled to a mixing pump 24. The mixing pump 24 may have no moving parts and may include a second gas inlet 26. The second gas inlet 26 may be used to introduce a gas such as carbon dioxide to the aerosolized form 18 of the material that is to form the lattice structure 18.

Carbon dioxide may be used as the gas because it may act as an inert gas when mixing with the carbon. The gas selected may be an inert gas relative to the material that is selected to form the lattice structure on the substrate. The mixing pump 24 may create a vacuum on the exit tube 22 to thereby function so as to draw the aerosolized carbon 18 from the agitating chamber 16 and into the mixing pump 24. The mixing pump 24 may also create a pressurized outlet 28. The carbon dioxide gas mixed with the aerosolized carbon 18 may be sent from the mixing pump 24 under some pressure to a head assembly 30. The pressure may only be enough to draw the aerosolized carbon 18 from the agitating chamber 16. There may be an advantage to heating the carbon dioxide gas prior to mixing with the aerosolized carbon 18 in the mixing pump 26 to thereby raise the temperature of the gas and aerosolized carbon 18 mixture that leaves the mixing pump 24.

The pressurized outlet 28 from the mixing pump 24 may feed the head assembly 30 that may be disposed on an actuator (not shown). The actuator may only function so as to move the head assembly 30 such that the head assembly may be pointed in a desired position above a substrate.

The head assembly 30 may contain at least one but typically several lasers 32. In the first embodiment, six lasers 32 are used, but this should not be considered a limiting factor and is not a limitation of the first embodiment. The aerosolized carbon 18 that is mixed in a stream of carbon dioxide gas may be directed to a location in the head assembly 30 so that the aerosolized carbon 18 may be heated by the one or more lasers 32 within a heating chamber 34 so that the carbon may be changed from a solid state into a gas. The lasers 32 may vaporize the aerosolized carbon 24 to prepare it for condensing into a desired lattice structure.

The aerosolized carbon 18 may be heated to a state where it is ionized which may be approximately 6500 degrees Fahrenheit. However, it should be understood that this temperature is only an approximation and the temperature may vary. What may be important is that the aerosolized carbon 18 be changed to a gas, and that the gas be ionized. The purpose for trying to obtain an ionized gas may be to increase the likelihood of the gas bonding with a substrate to create the desired lattice structure.

If a plurality of lasers 32 are used in the head assembly 30, the lasers may be positioned so as to focus on a desired location within the heating chamber 34 where the aerosolized carbon 18 may be changed to a gas. The alignment of the lasers 32 in the heating chamber 34 may be accomplished by any desired method, such as using a tungsten rod at a focusing point of the lasers. The color of the tungsten rod may be used as an indication of the temperature of the lasers at the focusing point in order to calibrate operation of the plurality of lasers 32. The color of the tungsten rod may then be used to ensure that the temperature of the plurality of lasers 32 at the focusing point is hot enough to cause the aerosolized carbon 18 to change to a gas. The aerosolized carbon 18 in the stream of gas may then be directed to the focusing point in the heating chamber 34 where the aerosolized carbon may be changed to a gas.

The heating chamber 34 may lead to a second chamber in the head assembly 30 that may be referred to as the head chamber 36. The head chamber 36 may be surrounded by an electromagnet 38. Another purpose of the electromagnet 38 may be to create a magnetic valve. Thus, the electromagnetic field may be used to control the flow of ionized particles 40 from the head chamber 36. The focusing point of the head assembly 30 where the plurality of lasers 32 create the ionized particles 40 may be directly above a first hole 42 that leads from the heating chamber 34 and into the head chamber 36. There may also be a second hole 44 that leads from the head chamber 36. The ionized particles 40 may exit the second hole 44 to be discharged in a direction of and onto a substrate 50.

In an alternative embodiment, the electromagnet 38 may be replaced by any device that is capable of magnetic induction such as an inductive plasma torch or other device that may have a coil or toroidal inductor that may induce a magnetic field The electromagnet 38 may be used to focus the ionized carbon gas into a stream of ionized particles 40. By moving the stream of ionized particles 40 into the center of an electromagnetic field, the ionized particles 40 may be prevented from coming into contact with the walls of the head chamber 36 and becoming contaminated.

The first hole 42 may be smaller than the second hole 44. The first embodiment may have a first hole 42 with a diameter of 0.040 inches and a second hole 44 with a diameter of 0.060 inches. However, these specific measurements are for illustration purposes only and should not be considered to be limiting of the dimension of holes that may be used.

The next step in the method of the first embodiment may be to provide the substrate 50 on which the ionized particles 40 may condense to create the desired lattice structure. FIG. 1 shows a substrate assembly 52 directly under the head assembly 30 and which may be used to condense the ionized particles 40 and provide a surface on which the ionized particles may bond to form graphene.

FIG. 2 shows a detailed cross-sectional view of the substrate assembly 52 of FIG. 1. It should be understood that the substrate assembly 52 is still inside the containment chamber 10 shown in FIG. 1. The first embodiment of the substrate assembly 52 begins by providing a copper bar 54 that may be used to cool the substrate 50. The substrate 50 may be cooled in order to create a desired temperature differential that may encourage condensing of the ionized particles 40 to the substrate. For example, the copper bar 54 may be cooled to approximately −20 to −50 degrees Celsius. However, it should be understood that the copper bar may be cooled to higher or lower temperatures and therefore these temperature should not be considered as limiting but are used for illustration purposes only.

The copper bar 54 may be insulated so that the environment around the copper bar is not cooled by the presence of the copper bar. A top surface of the copper bar 54 may not be insulated but is exposed in order to cause cooling of the substrate 50 that may be disposed above the copper bar. The copper bar 54 may also be insulated from the walls of the containment chamber 10 using any convenient system. For example, the copper bar 54 may be disposed on aluminum bars that are resting on rubber pads. This may prevent the copper bar 54 from receiving heat from the walls of the containment chamber 10. The shape of the cooper bar 54 may not be important to the first embodiment and may be made of any convenient dimensions.

It is important to create a temperature differential between the ionized particles 40 and the substrate 50. This may be accomplished in the first embodiment by cooling the copper bar 54 that is in contact with the substrate 50 and by heating the ionized particles 40. The temperature differential may enable the carbon in the ionized particles 40 to condense back into a solid and form the desired lattice structure of graphene on the substrate 50.

Unlike the prior art which required a metallic substrate because of the high temperature process within a pressurized chamber, the substrate 50 of the first embodiment may not have to be metal. The substrate 50 may be a polyethylene terephthalate (PET) material such as Mylar™ because the high temperatures that would destroy the Mylar™ material are not being used when the ionized particles 40 are condensing on the substrate. The substrate 50 may be adjacent to but not touching, or it may be in contact with the copper bar 54.

It should be understood that the substrate 50 may be any flexible or inflexible material as long as it is capable of being bonded to the lattice material being deposited thereon.

Figure 2:
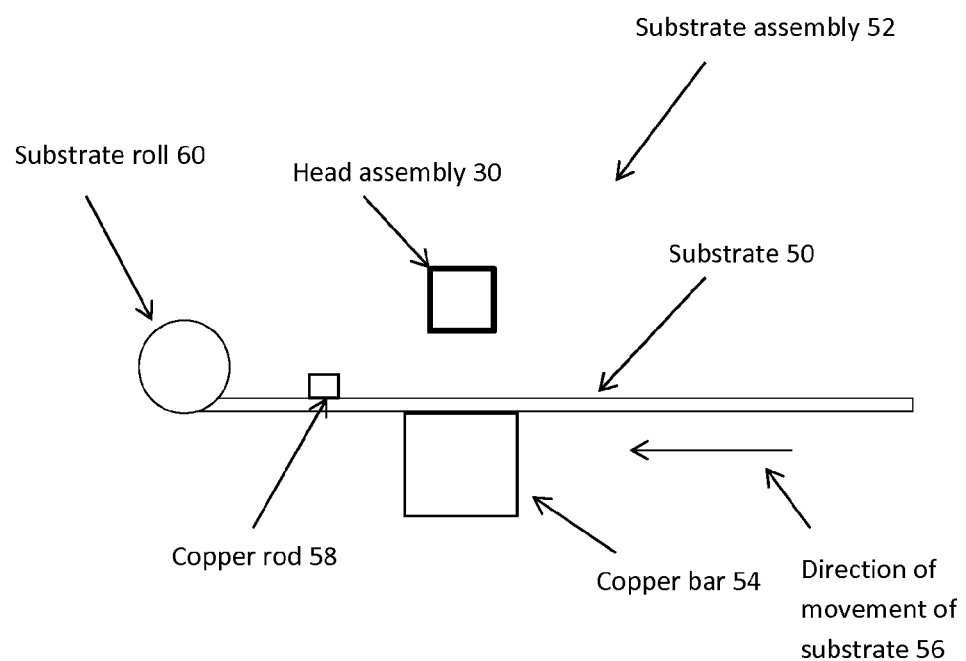
FIG. 2 is detailed view of the substrate assembly from an end-on or cross-sectional perspective.

One important feature of the first embodiment is the realization that the ionized particles 40 may be streaming in a steady flow from the head chamber 36. This means that the head assembly 30 may be moved back and forth by the actuator over the length of the substrate 50 that is resting adjacent to the copper bar 54. As the actuator moves back and forth over the copper bar 54, the substrate 50 may be moved incrementally in a first direction to expose a section of the substrate 50 that may not have a layer of graphene disposed thereon. In FIG. 2, an arrow 56 shows the direction that the substrate 50 may be moving. The actuator moving the head assembly 30 is not shown in FIG. 2. The system for incrementing the substrate 50 is not shown. The movement of the actuator and the substrate 50 may be accomplished by any means known to those skilled in the art and is not considered as a limiting part of the first embodiment. The substrate 50 may be sufficiently flexible and cool enough to be rolled into a substrate roll 60 after the lattice material is deposited thereon.

The first embodiment may also include a charged copper rod 58 that is placed over the surface of the substrate 50 that has most recently had the graphene disposed thereon. The charged copper rod 58 may be charged by passing a current through it. The copper rod 58 is charged so that it may be used to enhance or to assist in the reaction between the ionized particles 40 and the substrate 50.

To further assist with the beginning of the bonding process between the ionized particles 40 and the substrate 50, a short length of copper tape may be disposed directly on the surface of the substrate 50. The copper tape may be used to seed the bonding reaction between the ionized particles 40 and the substrate 50. After the copper tape has moved past the actuator and the head assembly 30, the charged copper rod 58 may remain above the substrate 50 in order to continue to provide a source of free electrons to assist the bonding process.

It should be understood that there may be other ways to provide a source of free electrons to the ionized particles 40 and the substrate 50 in order to assist with the bonding process and therefore the charged copper rod 58 may be replaced with another source of free electrons, and should not be considered as a limiting feature.

Figure 3:
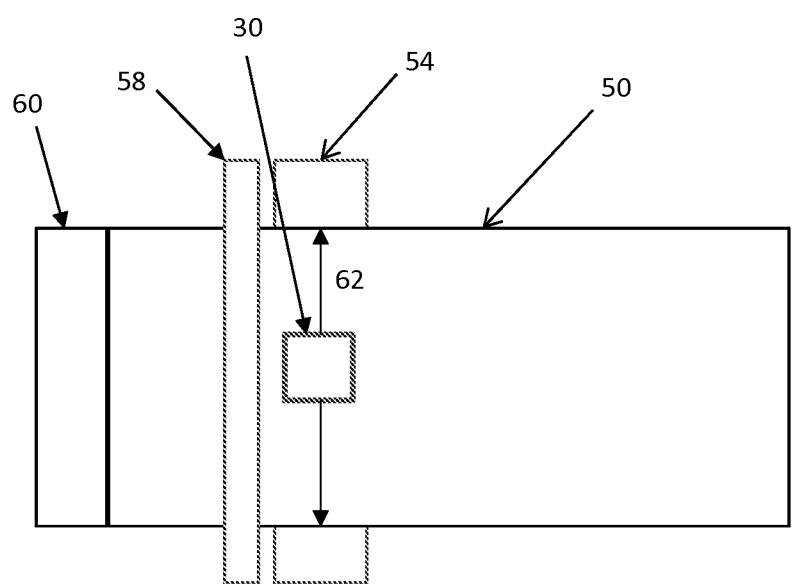
FIG. 3 is a top view of a portion of the elements shown in FIG. 2, wherein the movement of a head assembly relative to a substrate and a copper bar is shown in more detail.

FIG. 3 is a top view of a portion of the system shown in FIG. 2. The figure shows that the head assembly 30 is made to travel back and forth along the length of the copper bar 54 on the path illustrated by arrows 62, while the ionized particles 40 are streaming onto the surface of the substrate 50. The head assembly 30 may function as a print head, with the substrate 50 being slowly and incrementally moved in the first direction toward the substrate roll 60 as the head assembly 30 makes repeated passes over the substrate. FIG. 3 shows that the head assembly may be caused to move until it reaches the edge of the substrate 50. Then FIG. 3 shows that the head assembly 30 may reverse direction and move toward the opposite edge of the substrate 50 after the substrate has been incrementally moved toward the substrate roll 60.

The analogy of using the actuator to move the head assembly 30 may be thought of as a printing action where the head assembly is printing the lattice structure using the ionized particles 40. However, use of the word "printing" should not be considered as limiting or restricting the actual function being performed, which is to create one or more layers of the lattice material on a substrate.

It should also be understood that at any time, the direction of the substrate 50 may also be reversed so that it moves incrementally away from the substrate roll 60 and is essentially unrolled. The purpose of changing the direction of movement of the substrate 50 is to enable another layer of the lattice material to be deposited on a previous layer. In this way, multiple layers of the lattice material may be built up if that is desired. The lattice material may be built up or printed in as many layers are desired on the substrate 50.

In another aspect of the embodiments, instead of the actuator moving the stream of particles in order to print the lattice structure of the material on the substrate, the stream of ionized particles 40 may be kept stationary and the substrate 50 may be constantly repositioned under the stream of ionized particles.

The first embodiment may be used to produce sheets of graphene on a substrate 50. For example, a roll of substrate 50 may be created that is 40 inches wide and 1200 inches in length. The first embodiment may be able to produce a single layer of graphene or several layers of graphene on the substrate 50. The resulting graphene layer may be nearly lossless. The first embodiment may be accomplished in less time than the prior art. Furthermore, the substrate 50 may be of any desired length and width, and the process may be interrupted any number of times. Nevertheless, it should be understood that the dimensions in these examples are for illustration purposes only and should not be considered as limiting factors of the first embodiment.

Another aspect of the first embodiment is that the graphene may have greater uniformity in the lattice structure.

In another embodiment, the method and system above may be used to manufacture other materials that may be disposed as a thin layer. For example, the system and method may be used for the manufacturing of Molybdenum sulfide and Boron Nitride. It should be understood that these materials are for illustration purposes only and should not be considered as limiting factors of this embodiment. Any material that is capable of being vaporized by the plurality of lasers 32, formed into a stream of ionized particles and then condensed into a lattice structure on any appropriate substrate may be used in the embodiments of the invention.

In another embodiment of the present invention, the head chamber 30 was previously described as having a heating chamber 34 which leads to a head chamber 36. The head chamber 36 may be thought of as performing the process of plasma enhanced chemical vapor deposition (PECVD). This function may also be accomplished by an inductive plasma torch. The inductive plasma torch may be a quartz tube having a coil wrapped around it, but instead of a DC voltage/current going through the coil, a high power RF signal is sent through the coil. The inductive plasma torch may ionize and heat the particles to create the ionized particles 40. However, in this alternative embodiment, the process may be performed at room temperature and in a non-vacuum environment. The copper bar 54 may still be used as well as the plurality of lasers 32 as a prep mechanism to preheat and change the carbon into a gaseous state.

Finally, the charged "seeding" copper tape may have a negative ion generator connected to it to further enhance the process of creating the lattice structure on the substrate 50.

An important aspect of the invention is that the complexity of the process for manufacturing a lattice structure of a material on a substrate from a stream of ionized particles is substantially less complicated than the prior art because the process may be performed at atmospheric pressures, a continuous stream of ionized particles may be generated to thereby enable the lattice structure to be printed on the substrate, the substrate may be any material that is capable of bonding to the ionized particles, including any material that can be vaporized and then condensed on the selected substrate, and the process may have no toxic elements created or used in the process.

Only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. It is the express intention of the applicant not to invoke 35 U.S.C. §112, paragraph 6 for any limitations of any of the claims herein, except for those in which the claim expressly uses the words 'means for' together with an associated function.

What is claimed is:

1. A method for manufacturing a lattice material on a substrate from a stream of ionized particles, said method comprising:
   providing a containment chamber that is substantially at atmospheric pressure;
   creating a stream of ionized particles within the containment chamber;
   focusing the stream of ionized particles and ejecting the ionized particles toward a substrate within the containment chamber;
   creating a temperature differential between the ionized particles and the substrate; and
   condensing the ionized particles on the substrate at atmospheric pressure to thereby form a lattice material from the ionized particles.

2. The method as defined in claim 1 wherein the method further comprises selecting the substrate from the group of substrate materials comprised of any material that is capable of bonding with the ionized particles.

3. The method as defined in claim 1 wherein the method further comprises starting and stopping the process of condensing the ionized particles on the substrate by starting and stopping the creation of the ionized particles.

4. The method as defined in claim 1 wherein the method further comprises
   creating an aerosolized form of the lattice material;
   mixing the aerosolized form of the lattice material with a gas;
   delivering the aerosolized form of the lattice material with the gas to a heating chamber; and
   vaporizing the aerosolized form of the lattice material with the gas in the heating chamber to thereby form the ionized particles.

5. The method as defined in claim 4 wherein the method further comprises selecting the lattice material from the group of materials comprised of any material that can be vaporized to create the stream of ionized particles and then condensed to form the lattice material.

6. The method as defined in claim 4 wherein the method further comprises vaporizing the aerosolized form of the material with the gas in the heating chamber using a plurality of lasers.

7. The method as defined in claim 4 wherein the step of forming the ionized particles may be performed using an inductive plasma torch.

8. The method as defined in claim 4 wherein the step of creating an aerosolized form of the lattice material that is to form the lattice structure further comprises:
   providing an agitating chamber;
   disposing a powdered form of the lattice material into the agitating chamber; and
   agitating the lattice material to create the aerosolized form of the lattice material in the agitating chamber.

9. The method as defined in claim 8 wherein the method further comprises:
   providing a mixing pump that is coupled at one inlet to the agitating chamber and at a second inlet to a gas input;
   drawing the aerosolized form of the lattice material from the agitating chamber and into the mixing pump; and
   mixing a gas with the aerosolized form of the lattice material and sending the combination to the heating chamber to be ionized.

10. The method as defined in claim 1 wherein the method further comprises moving the stream of particles using an actuator to thereby print the lattice material on the substrate.

11. The method as defined in claim 1 wherein the method further comprises keeping the stream of particles stationary and using an actuator to thereby move and reposition the substrate to thereby print the lattice material on the substrate.

12. The method as defined in claim 1 wherein the method further comprises providing a copper bar disposed under the stream of ionized particles, wherein the substrate is disposed between the copper bar and the stream of ionized particles, wherein the copper bar is cooled to thereby decrease a temperature of the substrate to thereby assist in creating the temperature differential between the ionized particles and the substrate.

13. The method as defined in claim 1 wherein the method further comprises providing a charged copper bar adjacent to the surface of the substrate, wherein the charged copper bar assists in the reaction between the ionized particles and the substrate.

14. A method for printing a lattice structure of a material on a substrate from a stream of ionized particles, said method comprising:
- providing a containment chamber that is substantially at atmospheric pressure;
- creating a stream of ionized particles within the containment chamber;
- focusing the stream of ionized particles and ejecting the ionized particles toward a substrate within the containment chamber;
- creating a temperature differential between the ionized particles and the substrate;
- condensing the ionized particles on the substrate at atmospheric pressure to thereby form a lattice material from the ionized particles; and
- moving the stream of ionized particles over the substrate to thereby dispose at least one layer of the lattice material on the substrate wherever the stream of ionized particles makes contact with the substrate or with a previous layer of the lattice material.

* * * * *